United States Patent
Kühnberger et al.

(10) Patent No.: US 9,193,153 B2
(45) Date of Patent: *Nov. 24, 2015

(54) METHOD FOR PRODUCING A DECORATED PROFILE BODY

(71) Applicant: Rehau AG + Co, Rehau (DE)

(72) Inventors: Sven Kühnberger, Seibitz (DE); Oliver Hagen, Hof (DE); Stefan Eyhorn, Stuttgart (DE)

(73) Assignee: REHAU AG + CO, Rehau (DE)

(*) Notice: Subject to any disclaimer, the term of this patent is extended or adjusted under 35 U.S.C. 154(b) by 0 days.

This patent is subject to a terminal disclaimer.

(21) Appl. No.: 13/798,473

(22) Filed: Mar. 13, 2013

(65) Prior Publication Data

US 2013/0273336 A1    Oct. 17, 2013

Related U.S. Application Data

(63) Continuation of application No. 12/808,373, filed as application No. PCT/EP2008/009666 on Nov. 14, 2008.

(30) Foreign Application Priority Data

Dec. 20, 2007   (DE) .................. 10 2007 062 479
Feb. 23, 2008   (DE) .................. 10 2008 010 738

(51) Int. Cl.
*B05D 1/36*    (2006.01)
*B41J 2/04*    (2006.01)
(Continued)

(52) U.S. Cl.
CPC ... *B41J 2/04* (2013.01); *B44C 1/00* (2013.01); *B44F 1/08* (2013.01); *B05D 1/36* (2013.01); *B05D 5/061* (2013.01); *B05D 5/066* (2013.01); *B05D 7/56* (2013.01); *B32B 37/153* (2013.01);
(Continued)

(58) Field of Classification Search
CPC ..... B44F 1/08; B32B 2451/00; B32B 38/145; G03F 3/10; B05D 5/061; B05D 5/066; B05D 7/56

See application file for complete search history.

(56) References Cited

U.S. PATENT DOCUMENTS 3,962,009 A * 6/1976 Minami et al. .................. 156/85
4,921,891 A * 5/1990 Cope ............................... 524/15
(Continued)

*Primary Examiner* — James M Mellott
(74) *Attorney, Agent, or Firm* — Da Vinci Partners LLC; John Moetteli

(57) ABSTRACT

A method for producing a decorated profile body comprises the following steps. In a first step, a profile body substrate is provided. In a second step, a decoration background is applied to the profile body substrate. In a third step, by means of a digital printing process, a decoration finish is applied to the profile body substrate which decoration finish covers the decoration background of the profile body substrate at least in some sections. The decoration finish is applied to the profile body substrate after the applied decoration background, wherein the decoration background and the decoration finish together form a decoration of the profile body substrate. This creates a decorated profile body in which the decoration background has a color composition which is a substantially expanded color space compared to the decoration finish. The decoration finish is printed using a digital printing process having a comparatively limited color space applied according to the CMYK principle. The color composition of the decoration background is selected in such a way that essentially no metamerism effect occurs between the decoration of the decorated profile body and an adjacent reference decoration of a furniture panel, the reference decoration being substantially identical thereto.

16 Claims, 2 Drawing Sheets

(51) Int. Cl.
  *B44C 1/00* (2006.01)
  *B44F 1/08* (2006.01)
  *B05D 7/00* (2006.01)
  *B05D 5/06* (2006.01)
  *G03F 3/10* (2006.01)
  *B32B 37/15* (2006.01)
  *B32B 38/00* (2006.01)

(52) U.S. Cl.
  CPC ......... *B32B 38/145* (2013.01); *B32B 2307/404* (2013.01); *B32B 2451/00* (2013.01); *G03F 3/10* (2013.01); *Y10T 428/24802* (2015.01)

(56) References Cited

U.S. PATENT DOCUMENTS

| | | | | |
|---|---|---|---|---|
| 5,597,620 | A | * | 1/1997 | Martino ............... 427/262 |
| 6,066,367 | A | * | 5/2000 | Nishibori ............. 427/274 |
| 2003/0020767 | A1 | * | 1/2003 | Saksa .................. 347/2 |
| 2005/0064338 | A1 | * | 3/2005 | Leahy et al. ......... 430/300 |
| 2006/0060592 | A1 | * | 3/2006 | Kamite ................ 220/737 |
| 2007/0092701 | A1 | * | 4/2007 | Jeng ................... 428/195.1 |
| 2008/0118713 | A1 | * | 5/2008 | Bordener ............. 428/192 |

* cited by examiner

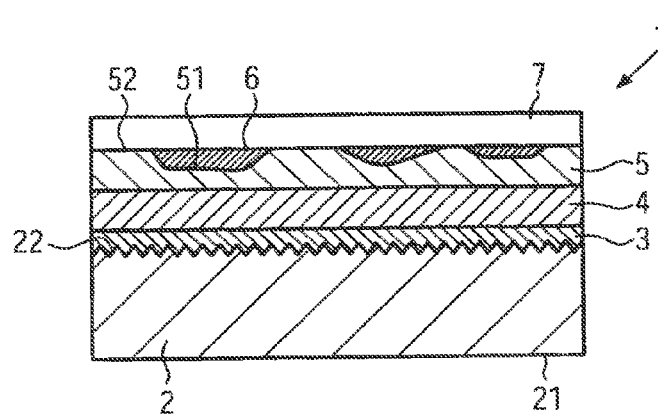
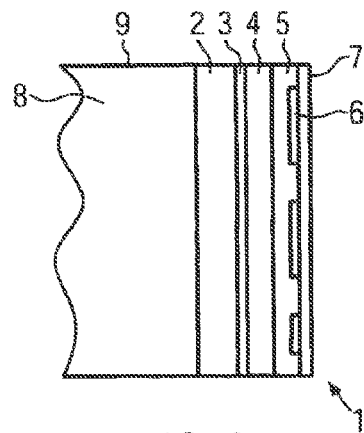
FIG. 1
FIG. 3
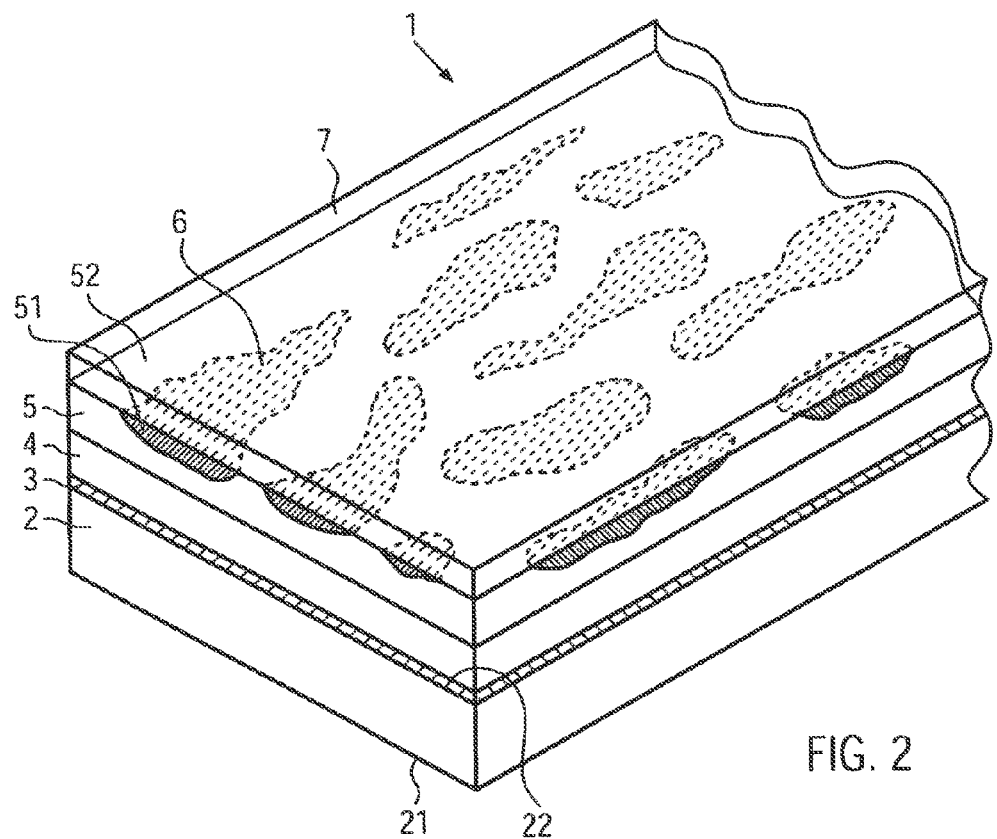
FIG. 2

METHOD FOR PRODUCING A DECORATED PROFILE BODY

CROSS REFERENCE TO RELATED APPLICATIONS

This application is a continuation application of U.S. National Stage application Ser. No. 12/808,373, filed Oct. 4, 2010, US National Stage of PCT/EP2008/009666, filed Nov. 14, 2008, claiming priority to German patent application Ser. No. 10 2007 062 479.6, filed Dec. 20, 2007 and German patent application Ser. No. 10 2008 010 738.7, filed Feb. 23, 2008, the contents of which are incorporated by reference.

BACKGROUND OF THE INVENTION

The present invention relates to a method for producing a decorated profile body, comprising the steps: providing a substrate; applying a decoration background; and applying by means of the digital printing process a decoration finish which covers the decoration background at least in some sections, wherein the decoration background and the decoration finish together form a decoration of the profile body.

In the furniture industry, conventional printing processes, such as e.g. the gravure printing process, are used for decorating table tops and kitchen worktops. The characteristic appearance of this decoration (hereinafter: reference decoration) changes color when the type of light changes. The color impression of the decoration of a profile body (e.g. edgeband) attached to the panel must change in the same way as the reference decoration, since otherwise the so-called metamerism effect occurs. The term "metamerism" is defined in DIN 6172 and denotes an effect according to which two samples which look the same under one type of light exhibit a color difference under another type of light.

The decoration templates or template panels from the furniture industry exhibit a wide palette of color pigments and are usually printed using water-based inks, wherein a colored absorbent paper is used as the decoration carrier or substrate. The choice of pigment for these printing inks is limited hardly at all by the method. On the other hand, the inkjet printing process allows only a limited choice of color pigments on account of the method. However, in order to print the reference decoration also onto other substrates, in particular polymeric substrates, such as wall connection profiles and edgebands, the use of identical pigment types and sizes is primarily the basic prerequisite for a printed structure that exhibits no metamerism.

When printing substrates by means of the digital inkjet printing technique using the "drop on demand" and "continuous inkjet" methods, the color systems used are usually developed for the respective printing head and are specially adapted to the material to be printed. The color composition usually takes place according to the CMYK principle, i.e. by combining the colors cyan, magenta and yellow and black (Key). In the case of digital printing with a color composition according to the CMYK principle, therefore, only a limited color choice is available compared to conventional printing processes, such as e.g. the gravure printing process, and this color choice is not sufficient to avoid the metamerism effect.

What is needed therefore is a method of providing a decorated profile body and a method for the production thereof, according to which the entire color space of conventional printing processes, such as e.g. the gravure printing process, can be recorded also in the case of digital printing of the profile body, and thus a metamerism effect can be at least largely prevented.

SUMMARY OF THE INVENTION

In order to achieve this object, the present invention provides the method for producing a decorated profile body, comprising the steps: providing a substrate; applying a decoration background; and applying by means of the digital printing process a decoration finish which covers the decoration background at least in some sections; wherein the decoration background and the decoration finish together form a decoration of the profile body; wherein the decoration background has a color composition consisting of an expanded color space compared to the decoration finish, wherein the color composition of the decoration background is selected in such a way that essentially no metamerism effect occurs between the decoration of the profile body and a reference decoration which is similar, preferably identical, thereto. Digital printing processes means digitally controlled printing processes, such as e.g. inkjet printing processes, toner processes (e.g. using a laser), electrophotography, ionography, magnetography, thermography or the like. The invention builds essentially on the fact that the decoration background and the decoration finish together form the visible decoration of the profile body. The decoration finish is applied e.g. according to the CYMK principle using the inkjet printing process and has the limited color space.

The decoration background expands the limited CYMK color space by a targeted choice of colorant so that, even when the profile body is printed digitally with a color composition according to the CMYK principle, the entire color space of conventional printing processes, such as e.g. the gravure printing process, can be recorded and displayed, and thus a metamerism effect can be substantially prevented. As a result, it is possible to simulate any reference decorations also by means of a digital printing process, without any significant metamerism effect occurring.

It is also within the scope of the invention in particular that the decoration finish is applied to the substrate before the decoration background. This allows the method according to the invention to be used also on clear, i.e. transparent or translucent, substrates which are printed on the rear side, as described e.g. in DE 1 964 911 U.

It may prove advantageous if the decoration background comprises two differently colored base layers. These differently colored base layers will be referred to below as the universal base layer and the individual base layer.

The so-called universal base layer is applied to the substrate in order to even out any irregularities (e.g. color nuances, etc.) of the substrate which are brought about by the manufacturing process or to neutralize the substrate from the color point of view, so that the decoration can be reproduced with high precision and color accuracy. In this state, the substrate is kept in stock for further processing.

The so-called individual base layer is preferably applied only once the specific intended use is known, and may already contain a basic shade of the decoration that is to be achieved. In addition, the individual base layer may already be colored in a shade corresponding to the basic shade of the reference decoration, wherein the decoration of the profile body is preferably matched to the reference decoration.

The individual base layer preferably contains an individually mixed special color, wherein the color composition of the individual base layer is selected from an expanded color space compared to the decoration finish. The decoration finish has e.g. a color composition selected from the CYMK color space.

By virtue of this combination of individual base and decoration finish, the color space of the decoration of the profile body can be expanded beyond the given color space of the pure scale colors. The fine-tuning of the shades of the individual base layer and of the decoration finish may take place by means of suitable software. The individual base layer may be, but does not have to be, part of the visible decoration of the profile body. However, a part that is not openly visible nevertheless has a considerable influence on the appearance and the color effect of the decoration of the profile body, since the decoration finish usually does not provide complete coverage, due to non-covering pigments. By virtue of targeted pigment selection and mixing of color, this effect can be used to control the individual base layer in such a way that the change in color of the decoration of the profile body when the light changes takes place in the same way as the reference decoration, and thus metamerism effects can be avoided.

It may prove useful if a translucent or transparent substance is applied at least in some sections as the decoration finish, e.g. by using non-covering pigments. As a result, results which are particularly pleasing from the optical and esthetic point of view can be achieved. Moreover, the design scope is considerably expanded as a result, since the layers of the profile body which are located below the decoration finish can also be included in the visible decoration and can thus contribute to the optical and esthetic overall impression of the profile body.

It may be advantageous if the decoration finish is radiation-cured. The drying time of the decoration finish can be considerably shortened as a result.

It may prove practical if the substrate is made from a polymeric material, in particular plastic. With such substrates, the principle of the invention can be implemented with particular advantage. The application of colored decorations to such substrates is usually more challenging than to paper-containing substrates for example. Due to the decoration background, the adhesion of colored decorations to polymeric substrates is considerably improved and the color choice for the image on the decorated profile body is considerably expanded.

It may likewise prove advantageous if the substrate is an extruded profile, preferably an edgebanding profile, a wall connection profile, a window profile or a roller shutter profile, or else alternatively a film, e.g. a calendered film.

Such substrates or profile bodies are often used in conjunction with other decorated objects, such as e.g. kitchen worktops, table tops, cabinets, etc., where a high-quality optical and esthetic appearance of the product depends on the most accurate possible matching of the decorations, specifically against the background of the metamerism effects which occur when the light changes.

By virtue of the method according to the invention, a decorated profile body can be provided which satisfies the strictest optical and esthetic requirements specifically against this background. Due to the multilayer structure of the decoration background in conjunction with the decoration finish to be applied to the decoration background, color and decoration nuances can be displayed in much greater detail than was previously the case with conventional decorated profile bodies, and the decoration of the profile body can thus be better matched to a reference decoration.

It may also prove advantageous if at least one base layer is single-colored. This concerns in particular the universal base layer, which is applied in order to even out any irregularities of the substrate which are brought about by the manufacturing process and to provide an absolutely neutral base product for the subsequent image. This measure facilitates the processes of color mixing and coloring and makes it possible to reproduce the neutral base product with high precision.

It may prove useful if at least one base layer is colored in a dark shade. By coloring the decoration background, in particular the universal base layer, in a dark shade, there is a reduction in the coloring effort and in the amount of ink to be applied for the individual base layer and the decoration finish if the intention is to produce an image with a rather dark shade. An intermediate product with the decoration background, in particular the universal base layer, being colored in a dark shade is therefore provided for creating the image with a rather dark shade.

It may also prove useful if at least one base layer is colored in a light shade, preferably white. By coloring the decoration background, in particular the universal base layer, in a light shade, there is a reduction in the coloring effort and in the amount of ink to be applied for the individual base layer and the decoration finish if the intention is to produce an image with a rather light shade. An intermediate product with the decoration background, in particular the universal base layer, being colored in a light shade is therefore provided for creating the image with a rather light shade.

It may be helpful if at least one base layer, preferably the base layer directly adjacent to the decoration finish, is colored in a shade corresponding to the basic shade of the decoration finish.

By coloring the decoration background, in particular the individual base layer, in a shade corresponding to the basic shade of the decoration finish, there is a reduction in the amount of ink to be applied for the decoration finish. Furthermore, color and decoration nuances can be displayed in a particularly detailed manner as a result and can be matched to the reference decoration.

It may also be helpful if at least one base layer is applied by means of the digital printing process, e.g. the inkjet printing process. As a result, the costs of carrying out the method according to the invention are considerably reduced.

It may also be practical if at least one base layer contains a solvent-based ink, a radiation-curable ink, preferably a UV-curable ink, and/or a water-based ink. Such inks can be used with particular advantage in the method according to the invention.

It may moreover be advantageous if at least one base layer is applied over the entire surface and/or in a covering manner. As a result, the construction of the profile body according to the invention is simplified. A color choice for a layer of the profile body arranged below the covering base layer need not be made on the basis of optical and esthetic aspects.

However, it may also be advantageous if at least one base layer is applied with an uneven thickness. As a result, spatial decorations can be displayed, which considerably increases the design scope compared to conventional profile bodies. In this case, use may be made in particular of the fact that the profile body according to the invention has two base layers. The thickness of the base layers is preferably in each case between 1 and 500 µm.

It may prove helpful if at least one base layer is applied in such a way as to form at least one depression and at least one raised area. As a result, three-dimensional decorations with a particularly spatial effect can be displayed, which further broadens the design scope compared to conventional profile bodies.

It may prove advantageous if the decoration finish is applied essentially in the region of at least one depression of a base layer. There, the substrate applied as the decoration finish exhibits particularly good adhesion, and particularly pleasing images having a depth effect can be displayed.

It may prove practical if the decoration finish is applied in such a way as to substantially fill the depression. This considerably facilitates the application of the decoration finish and prevents any smudging, smearing or running of the substance applied as the decoration finish.

It may prove helpful if the thickness of the decoration finish behaves inversely to the thickness of the decoration background, so that the decoration background and the decoration finish are applied with a constant overall thickness. As a result, despite the depth effect of the image, a decorated profile body which has a smooth surface can be produced.

It may prove advantageous if a clearcoat layer which covers the decoration finish at least in some sections is applied. As a result, the image is sealed and is protected against soiling and physical impairment.

However, it may also prove advantageous if a transparent or translucent substrate is provided and the decoration finish is applied to the rear of the substrate before the decoration background. As a result, the profile strip can be attached by its rear to an object, with the decoration of the profile body still being visible through the transparent or translucent substrate. The decoration is not impaired during subsequent machining of the front visible edges of a profile body designed as an edgeband. Located behind the substrate, the decoration is also protected against any other mechanical effects. In particular, however, moving the decoration of the profile body to the rear side of the substrate makes it possible to achieve a spatial "3D" effect which optically and esthetically enhances the appearance of the profile body compared to decoration on the front side and considerably expands the freedom of design.

One preferred embodiment of the invention relates to an object comprising at least one decorated surface and a decorated profile body produced by the method according to one of the preceding embodiments, wherein the object comprises the reference decoration to which the decoration of the profile body is matched in such a way that essentially no metamerism effect occurs. To this end, preferably at least one base layer of the profile body is colored in a shade corresponding to the basic shade of the decorated surface. The object may be for example an in particular panel-shaped item of furniture, to the edge(s) of which the profile body is bonded, e.g. by means of an adhesion promoter.

The object according to the invention is of particularly high quality from the optical and esthetic point of view, since color differences and metamerism effects between the reference decoration and the decoration of the profile body are ruled out because the reference decoration and the decoration of the profile body change in similar color shades even when the light changes.

Another preferred embodiment of the invention relates to a decorated profile body, comprising: a substrate; a decoration background which covers the substrate at least in some sections; a decoration finish which covers the decoration background at least in some sections, wherein the decoration background and the decoration finish together form a decoration of the profile body, wherein the decoration background comprises two differently colored base layers. The two differently colored base layers, which are referred to as the universal base layer and the individual base layer, allow a particularly precise color composition of the decoration of the profile strip. The profile body according to the invention is preferably produced by the method according to the invention and can accordingly have all the features of the profile body produced by the method according to the invention.

BRIEF DESCRIPTION OF THE DRAWINGS

FIG. 1 shows a sectional view of the decorated profile body produced according to the invention, on a scale which has been distorted for the purpose of better clarity.

FIG. 2 shows a perspective view of the decorated profile body produced according to the invention, on a scale which has been distorted for the purpose of better clarity.

FIG. 3 shows the decorated profile body of FIGS. 1 and 2 produced according to the invention, in a state mounted on an object having a decorated surface.

DETAILED DESCRIPTION OF THE PREFERRED EXAMPLES OF EMBODIMENTS

Figure 4:
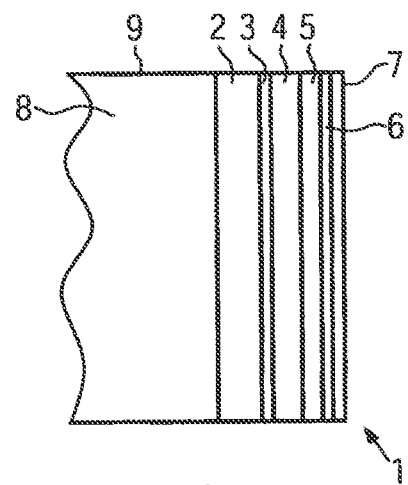
FIG. 4 shows a decorated profile body produced according to the invention with a decoration background applied over the entire surface and a decoration finish applied over the entire surface, in a state mounted on an object having a decorated surface.

The invention relates to a method for producing a decorated profile body 1, comprising the steps: a) providing a substrate 2; b) applying a decoration background 4, 5; and c) applying by means of the digital printing process a decoration finish 6 which covers the decoration background 4, 5 at least in some sections, wherein the decoration background 4, 5 and the decoration finish 6 together form a decoration of the profile body 1. The decoration background 4, 5 has a color composition consisting of an expanded color space compared to the decoration finish 6, wherein the color composition of the decoration background 4, 5 is selected in such a way that essentially no metamerism effect occurs between the decoration of the profile body 1 and a reference decoration which is similar, preferably identical, thereto. The reference decoration is preferably the decoration of a decorated surface 9 of an object 8.

The decoration background 4, 5 contains two differently colored base layers 4, 5, which are referred to as the universal base layer 4 and the individual base layer 5. However, it is also within the scope of the invention that the decoration background consists only of the individual base layer 5.

The decorated profile body 1 produced according to the invention will be explained below with reference to the appended drawings:

FIG. 1 shows a sectional view of the decorated profile body 1 produced according to the invention, on a scale which has been distorted for the purpose of better clarity.

The decorated profile body 1 comprises a substrate 2 with an underside 21 and an upper side 22, optionally a primer layer 3 to improve the adhesion of subsequent layers to the substrate 2, a universal base layer 4, an individual base layer 5 with depressions 51 and raised areas 52, a decoration finish 6 which preferably fills the depressions 51 of the individual base layer 5, and a clearcoat layer 7 applied over the entire surface. In FIGS. 1 to 3, the decorated profile body 1 is an edgeband. The decorated profile body 1 is attached by the underside 21 to an object 8, e.g. a kitchen worktop or a table top. In order to improve the optical appearance of the decorated profile body 1, the thickness of the individual base layer 5 behaves inversely to the thickness of the decoration finish 6, so that the overall thickness (sum of the thicknesses) of the individual base layer 5 and of the decoration finish 6 in each case remains constant. The primer layer 3 and the universal base layer 4 may also be combined as one layer which covers both functions of the layers 3 and 4.

FIG. 2 shows a perspective view of the decorated profile body 1 produced according to the invention, on a scale which has been distorted for the purpose of better clarity. On the upper side of the profile body 1, the decoration of the profile body 1 is visible through the clearcoat layer 7. The decoration of the profile body 1 is e.g. a wood grain or marbling effect, but is not subject to any limitation. As the clearcoat layer 7, a transparent or translucent lacquer is applied, which is preferably curable under the effect of UV radiation. If the clearcoat is colored, the clearcoat layer 7 can form part of the visible decoration of the profile body 1.

FIG. 3 shows the decorated profile body 1 of FIG. 1 produced according to the invention, in a state mounted on an object 8 having a decorated surface 9. The decorated surface 9 of the object 8 has a reference decoration. The decoration of the profile body 1 is matched to the reference decoration or is similar or identical to the reference decoration or has at least a similar or identical pattern. The individual base layer 5 is colored in a shade corresponding to the basic shade of the decorated surface 9 and matched to the decoration finish 6. The color matching of the individual base layer 5, the decoration finish 6 and the decorated surface 9 takes place by means of a software program, so that no metamerism effect or only a slight metamerism effect occurs between the decoration of the profile body 1 and the reference decoration.

FIG. 4 shows a decorated profile body 1 produced according to the invention with a decoration background 4, 5 applied over the entire surface and a decoration finish 6 applied over the entire surface, in a state mounted on the object 8 having a decorated surface 9 shown in FIG. 3. The layer structure of the profile body 1 shown in FIG. 4 corresponds essentially to the layer structure of the profile body 1 shown in FIG. 3, with the exception that the decoration background 4, 5 and the decoration finish 6 are applied over the entire surface.

Figure 5:
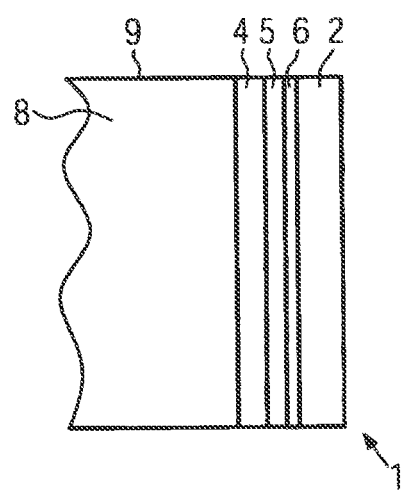
FIG. 5 shows a decorated profile body produced according to the invention with a decoration background applied over the entire surface and a decoration finish applied over the entire surface, in a state mounted on an object having a decorated surface, wherein the substrate is transparent and the decoration background and the decoration finish are arranged on the substrate underside.

FIG. 5 shows a decorated profile body 1 produced according to the invention with a decoration background 4, 5 applied over the entire surface and a decoration finish 6 applied over the entire surface, in a state mounted on the object 8 having a decorated surface 9 shown in FIG. 3, wherein the substrate 2 is transparent and the decoration background 4, 5 and the decoration finish 6 are applied to the rear side of the substrate 2. The decoration of the profile body 1 is matched to the reference decoration of the decorated surface 9 of the object 8.

The profile bodies 1 shown in FIGS. 1 to 5 can be attached to the object 8, e.g. a furniture panel, in a known manner by means of an adhesion promoter (not shown in detail). While in the embodiments shown in FIGS. 1 to 4 the adhesion promoter is arranged between the object 8 and the substrate 2, in the example shown in FIG. 5 it is located between the decoration background 4 and the object 8. In this case, it may be advantageous to color the adhesion promoter in order e.g. to increase the color coverage of the overall structure.

The individual base layer 5 is colored in a shade corresponding to the main shade of the decorated surface 9 and matched to the decoration finish 6. The color matching of the individual base layer 5, the decoration finish 6 and the decorated surface 9 takes place by means of a software program, so that no metamerism effect or only a slight metamerism effect occurs between the decoration of the profile body 1 and the reference decoration.

As a result, the invention is characterized in that metamerism effects in digital printing can be avoided by means of the described method. One particular characteristic is that, if the decoration finish 6 contains translucent inks, the individual base layer has an influence on the appearance of the finished decorated profile body 1 even at the location where the decoration finish 6 is applied. The necessary "infinite number" of shades (special color space) for the individual base layer 5 can be achieved either by conventional printing or else by digital printing, e.g. by means of an inkjet process.

The steps of the method according to the invention will be explained in detail below:

Step a): Using an extrusion die, an extruded profile body is provided which is referred to as the substrate 2 in the context of the invention. Alternatively, a calendered profile body, e.g. a film, may also be used. The substrate 2 is preferably provided as an edgebanding profile, wall connection profile, window profile, roller shutter profile, film, e.g. in calendered form, or the like. The term or word stem "provide" is to be understood in this connection to mean that the substrate 2 is either produced immediately prior to further processing or is supplied already in a pre-manufactured state to the subsequent further processing steps. The substrate 2 is made from a polymeric material, in particular plastic, preferably polypropylene (PP), polyvinyl chloride (PVC), acrylonitrile butadiene styrene (ABS), polymethyl methacrylate (PMMA) or polyethylene terephthalate (PET). To this end, the material which exists in granular form is melted in the extrusion device and is transformed by the extrusion device into a particular cross-sectional shape, wherein the desired cross-sectional shape of the substrate 2 is calibrated in a downstream calibrating device and fixed.

In a subsequent step, the substrate upper side 22 located opposite the substrate underside 21 is subjected to a preferably—in particular in the case of polyolefin materials—physical treatment, for example by means of corona treatment, in order to increase the surface energy and to roughen the surface 22 so as to improve the adhesion of subsequent layers.

Optionally, in particular in the case of substrates 2 made from the material polypropylene, a primer layer 3 is applied to the preferably pre-treated surface 22 in order to further improve the adhesion of subsequent layers.

Step b): In a universal base layer application device, a universal base layer 4 is then applied. The universal base layer 4 is a neutral color layer to even out irregularities brought about by the manufacturing process, such as e.g. color nuances or unevenesses, etc. of the substrate 2, and is applied to the substrate 2 or to the primer layer 3 over the entire surface. The application takes place conventionally by means of printing rollers or in the digital printing process, preferably via a special inkjet printing device. The ink systems used for the universal base layer 4 are solvent-based inks, UV-curing inks and water-based inks.

The universal base layer 4 is opaque, i.e. it covers preferably the entire surface of the layer located therebelow (the substrate 2 or the primer layer 3). The universal base layer 4 is colored in a light or dark shade in order to be able to carry out a basic sorting for further processing. A substrate 2 with a universal base layer 4 in a light shade (e.g. white) is provided for creating an image with a light basic shade, and a substrate 2 with a universal base layer 4 in a dark shade is provided for creating an image with a dark basic shade. This precursor product manufactured in this way is then kept in stock and held ready for final processing.

During final processing, the individual base layer 5 is applied to the universal base layer 4. The universal base layer 4 is selected in such a way that as little additional coloring as possible by the individual base layer 5 is required. In general, it is possible for example in extreme cases to work only with a few universal base layer colors. The individual base layer 5 is opaque, i.e. it covers preferably the entire surface of the universal base layer 4 located therebelow and is colored in a shade which corresponds to the basic shade of a decoration template such as a decorated surface 9 of an object 8 (e.g. table top or kitchen worktop; FIG. 3) and the basic shade of the decoration finish 6.

The individual base layer 5 may be applied conventionally by means of printing rollers or likewise in the digital printing process, e.g. via a special inkjet printing device with an expanded color space (special color space). The possible ink systems which can be used for the individual base layer 5 are selected from solvent-based inks, UV-curing inks and water-based inks.

Step c): in a subsequent step, the decoration finish 6 is applied by an inkjet printing device in the inkjet printing process (inkjet process). The decoration finish 6 has a color composition consisting of the CMYK color space, i.e. a combination of the colors cyan, magenta and yellow and black (Key). The decoration finish 6 is usually applied as a glaze and does not cover the entire surface, and is therefore applied as a transparent or translucent substance.

Targeted pigment selection and mixing of the color of the individual base layer 5 helps the decoration of the profile body 1 to change color in the same way as the reference decoration when the light changes, so that essentially no metamerism effect occurs.

An individual base layer 5 over the entire surface moreover has the advantage that the printed dot formation and the adhesion of the decoration finish 6 are considerably improved. The decoration finish 6 is preferably applied to the individual base layer 5 only in some sections, preferably only in the regions of the depressions 51 in order to fill these depressions 51. In this case, the thickness of the decoration finish 6 behaves inversely to the thickness of the individual base layer 5, so that the overall thickness (sum of the thicknesses) of the individual base layer 5 and of the decoration finish 6 in each case remains constant. The substance applied as the decoration finish 6 is preferably radiation-curable, preferably UV-curable, and is cured as a result of exposure to a radiation source. Optionally, a clearcoat layer 7 is additionally applied in order to seal and protect the decoration of the profile body 1.

By virtue of the individually mixed special color of the individual base layer 5 in combination with the color of the decoration finish 6 selected from the CMYK color space, the color space of the decoration of the profile body 1 (consisting of the decoration background 4, 5 or universal base layer 4 and individual base layer 5 and the decoration finish 6) can be expanded by the given color space of the pure scale colors. The individual base layer 5 is integrated in the image or color composition of the decoration of the profile body 1 and is taken into account when defining the color.

The principle of the invention can be applied to any substrate 2 and is suitable in particular for polymeric substrates 2 such as extruded plastic profiles, in particular edgebanding profiles, wall connection profiles, window profiles and roller shutter profiles, but also for example films, e.g. calendered films, in particular films having a layer thickness≥0.05 mm, preferably a layer thickness of 0.2 to 0.4 mm.

LIST OF REFERENCES 1 profile body
2 substrate
3 primer layer
4 universal base layer
5 individual base layer
6 decoration finish
7 clearcoat layer
8 object
9 decorated surface
21 substrate underside
22 substrate upper side
51 depressions
52 raised areas

The invention claimed is:

1. A method for producing a furniture panel with a decorated surface and a decorated profile body, comprising the steps of:
   a. providing an edgebanding profile body substrate in a form of an extruded edgebanding profile;
   b. applying a decoration background to the edgebanding profile body substrate;
   c. applying, by means of a digital printing process, a decoration finish to the edgebanding profile body substrate in which the decoration finish covers a decoration background of the edgebanding profile body substrate at least in some sections, wherein the decoration finish is applied to the edgebanding profile body substrate after the applied decoration background, wherein the decoration background and the decoration finish together form a decoration of the edgebanding profile body substrate, thereby creating a decorated profile body, wherein the decoration background has a color composition selected from a substantially expanded color space compared to the decoration finish; wherein the decoration finish is printed using a digital printing process having a comparatively limited color space applied according to the CMYK principle wherein the digital printing process applies a combination of all of a cyan ink, a magenta ink, a yellow ink, and a black ink; and,
   d. mounting the decorated profile body via a decorated profile body underside to the furniture panel,
      wherein the color composition of the decoration background is selected in such a way that essentially no metamerism effect occurs between the decoration of the decorated profile body and an adjacent reference decorated surface of the furniture panel, the adjacent reference decorated surface being substantially identical thereto.

2. The method according to claim 1, wherein the decoration background contains differently colored base layers.

3. The method according to claim 1, wherein a translucent or transparent substance is applied at least in some sections as the decoration finish.

4. The method according to claim 1, wherein the decoration finish is radiation-cured.

5. The method according to claim 1, wherein the edgebanding profile body substrate is made from a polymeric material.

6. The method according to claim 1, further including at least one base layer, and wherein the at least one base layer is single-colored.

7. The method according to claim 1, further including at least one base layer, and wherein the at least one base layer is colored in a color shade.

8. The method according to claim 1, further including at least one base layer, and wherein the at least one base layer is colored in a shade, the shade being white.

9. The method according to claim 1, further including at least one base layer, and wherein the at least one base layer is directly adjacent to the decoration finish, and the at least one base layer being colored in a shade corresponding to a basic shade of a reference decoration.

10. The method according to claim 1, further including at least one base layer, and wherein the at least one base layer is applied by means of an inkjet printing process.

11. The method according to claim 1, further including at least one base layer, and wherein the at least one base layer contains a solvent-based ink, a radiation-curable ink, UV-curable ink, and/or a water-based ink.

12. The method according to claim 1, further including at least one base layer, and wherein the at least one base layer is applied over an entire surface and/or in a covering manner.

13. The method according to claim 1, further including at least one base layer, and wherein the at least one base layer is applied in such a way that at least one depression and/or at least one raised area is formed.

14. The method according to claim 1, wherein the decoration finish is applied essentially in the region of at least one depression of a base layer.

15. The method according to claim 1, wherein the decoration finish is applied in such a way as to substantially fill a depression.

16. The method according to claim 1, wherein a thickness of the decoration finish behaves inversely to a thickness of the decoration background, so that the decoration background and the decoration finish are applied with a constant overall thickness.

* * * * *